(12) United States Patent
Morgenstern

(10) Patent No.: US 6,593,242 B2
(45) Date of Patent: Jul. 15, 2003

(54) PROCESS FOR PLANARIZATION AND RECESS ETCHING OF INTEGRATED CIRCUITS

(75) Inventor: Thomas Morgenstern, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/223,038

(22) Filed: Aug. 16, 2002

(65) Prior Publication Data

US 2003/0022510 A1 Jan. 30, 2003

Related U.S. Application Data

(63) Continuation of application No. PCT/EP01/00715, filed on Jan. 23, 2001.

(30) Foreign Application Priority Data

Feb. 16, 2000 (EP) .............................................. 00103154

(51) Int. Cl.⁷ ........................ H01L 21/311; H01L 21/44
(52) U.S. Cl. ........................ 438/700; 438/706; 438/710; 438/719; 438/657
(58) Field of Search ................................. 438/700, 745, 438/706, 723, 725, 735, 710, 647, 657, 669, 684, 719

(56) References Cited

U.S. PATENT DOCUMENTS

| 4,367,044 A | | 1/1983 | Booth, Jr. et al. |
| 5,252,506 A | | 10/1993 | Carter et al. |
| 5,358,891 A | | 10/1994 | Tsang et al. |
| 5,792,708 A | * | 8/1998 | Zhou et al. ................. 438/647 |
| 5,904,570 A | * | 5/1999 | Chen et al. .................. 438/725 |
| 6,214,736 B1 | * | 4/2001 | Rotondaro et al. ......... 438/705 |
| 6,235,214 B1 | * | 5/2001 | Deshmukh et al. ........... 216/67 |
| 6,242,357 B1 | * | 6/2001 | Wei et al. .................... 438/700 |
| 6,326,275 B1 | * | 12/2001 | Harrington et al. ......... 438/386 |
| 6,372,655 B2 | * | 4/2002 | Khan et al. ................. 438/714 |
| 6,468,889 B1 | * | 10/2002 | Iacoponi et al. ............ 438/597 |
| 6,475,915 B1 | * | 11/2002 | Wang .......................... 438/689 |
| 2001/0051439 A1 | * | 12/2001 | Khan et al. ................. 438/710 |

FOREIGN PATENT DOCUMENTS

| EP | 0 905 758 A2 | 3/1999 |
| JP | 04 159 781 | 6/1992 |

OTHER PUBLICATIONS

Ramaswami, S. et al.: "Polysilicon Planarization Using Spin–On Glass", Journal of Electrochemical Society, vol. 139, No. 2, Feb. 1992, pp. 591–599.
Yeom, G.–Y. et al.: "Polysilicon Etchback Plasma Process Using HBr, $Cl_2$ and $SF_6$ Gas Mixtures for Deep–Trench Isolation", Journal of the Electrochemical Society, vol. 139, No. 2, Feb. 1992, pp. 575–579.

\* cited by examiner

Primary Examiner—Michael S. Lebentritt
(74) Attorney, Agent, or Firm—Laurence A. Greenberg; Werner H. Stemer; Ralph E. Locher

(57) ABSTRACT

The invention is directed to a process for forming a recess in at least one polysilicon overfilled trench in an integrated circuit. The process includes the following steps: uniformly etching the polysilicon overfill layer; stopping the etching before the polysilicon layer is completely removed from the surface of the integrated circuit; and recess etching the polysilicon layer with microtrenching properties for forming a substantially planar recess near the top of the at least one trench.

14 Claims, 3 Drawing Sheets

PROCESS FOR PLANARIZATION AND RECESS ETCHING OF INTEGRATED CIRCUITS

CROSS-REFERENCE TO RELATED APPLICATION

This application is a continuation of copending International Application No. PCT/EP01/00715, filed Jan. 23, 2001, which designated the United States and was published in English.

BACKGROUND OF THE INVENTION

Field of the Invention

For a number of uses, e.g. for fabricating capacitors within integrated circuits, cavities are created in the lower layer of the circuit. Such cavities are generally called trenches. When forming a capacitor, such a cavity is also called a deep trench.

Conventionally, a trench is formed in the single crystal silicon and is then later filled with polysilicon. The polysilicon is deposited onto the entire surface of the wafer containing the integrated circuit and into the trench. This is done, for example with a low pressure chemical vapour deposition process. The deposition leads to a layer that completely fills the trench. To ensure that the trench is completely filled, the trench is overfilled which leads to a polysilicon layer with minor indentations that indicate the location of the trenches.

After the deposition of the polysilicon, the excessive polysilicon must be removed. This is conventionally done by two process steps which are called Planarization and Recess etch. In the first step, a CMP (chemical mechanical polishing) process is utilised to remove any polysilicon from the uppermost surface. So that the structure of the silicon is not impaired, a nitride layer is deposited onto the silicon prior to forming the trench. This nitride layer acts as an etch and polish stop layer. The CMP planarization is processed with a fixed time. This provides the opportunity to overpolish the polysilicon. Next, the recess etch step, a plasma etch process, is used to remove some of the polysilicon from within the trenches.

This known process has a severe disadvantage. While all other polysilicon planarizations employed in manufacturing integrated circuits can be done within integrated processes, the CMP process of this planarization has to be handled separately. This complicates the planarization, increases the risk of damage, and results in a higher cost.

U.S. Pat. No. 5,252,506 discloses a method for etching a trench filled with polysilicon. The polysilicon top layer is first etched with SF6/He in a timed etch process. The resulting structure is followed by patterning the polysilicon top layer to create openings. An additional patterning step occurs by coating, exposing, and developing a resist. Finally, a two step poly overetch follows using SF6/He in the first step and Cl1/He in the second step.

In the article Shrinath Ramaswami et al.: "Polysilicon Planarization Using Spin-On Glass", Journal of the Electrochemical Society, Vol. 139, No. 2, Feb. 1, 1992, pages 591–599 a trench filled with polysilicon is first coated with spin-on glass using carbone/fluorine etch chemistry with changing C/F-ratios.

SUMMARY OF THE INVENTION

It is accordingly an object of the invention to provide a process for forming a recess in at least one polysilicon overfilled trench in an integrated circuit which overcomes the above-mentioned disadvantages of the prior art processes of this general type.

In particular, it is an object of the present invention to modify the planarization step and the recess etch step in order to arrive at a process that can be better integrated.

With the foregoing and other objects in view there is provided, in accordance with the invention, a process for forming a recess in at least one polysilicon overfilled trench in an integrated circuit. The process includes steps of: uniformly etching a polysilicon overfill layer using a gas mixture including SF6 and CF4; stopping the etching before the polysilicon layer is completely removed from a surface of the integrated circuit; and recess etching the polysilicon layer with microtrenching properties using a gas mixture including hydrogen bromine and chlorine for forming a substantially planar surface of the polysilicon layer within the trench.

In accordance with an added feature of the invention, the etching includes a plasma etching.

In accordance with an additional feature of the invention, the stopping of the etching is decided based on measuring a layer thickness of the polysilicon layer.

In accordance with another feature of the invention, the measuring of the layer thickness of the polysilicon layer is performed by interference spectrometry.

In accordance with a further feature of the invention, a nitride layer is interposed between the silicon of the integrated circuit and the polysilicon layer.

In accordance with a further added feature of the invention, the interference spectrometry uses the polysilicon layer and the nitride layer.

In accordance with a further added feature of the invention, the stopping of the etching is performed when the polysilicon layer that remains is between 10 and 30 nm thick.

In accordance with a further additional feature of the invention, the stopping of the etching is performed when the polysilicon layer that remains is about 20 nm thick In accordance with yet an added feature of the invention, the recess etching is performed using a helium/oxygen mixture.

In accordance with yet an additional feature of the invention, the trench is part of a capacitor.

In accordance with yet another feature of the invention, the polysilicon layer is deposited onto the integrated circuit using a low-pressure chemical vapour deposition process.

In accordance with an added feature of the invention, the etching of the polysilicon layer and the recess etching of the polysilicon layer are performed within the same etch chamber, preferably without breaking the vacuum.

By using the inventive process, the CMP process step which was hitherto necessary, can be entirely avoided. The inventive process allows an integrated approach, so that an interruption is no longer needed.

The etching step may include a plasma etching. In general, this step will be performed as any plasma etching commonly known to be suitable for etching polysilicon layers, e.g. with a high density plasma etch tool, i.e. a particular kind of plasma chamber.

The time to stop the etching is preferably determined based on measuring the layer thickness of the polysilicon layer. By monitoring the thickness of the remaining polysilicon layer, the inventive process can be fine tuned to achieve the desired aim.

Such measuring of the thickness of the polysilicon layer can be performed by interference spectrometry, which allows a precise measurement of the thickness. The interference spectroscopy uses the reflection of the emitted waves from surfaces. Throughout the etching process, when the thickness of the polysilicon layer decreases below a certain threshold, the layer becomes transparent for the incident light which is then also partly reflected from the next surface, e.g. the base silicon or a further layer overlaying this silicon.

Such a further layer may be a nitride layer that is interposed between the silicon of the integrated circuit and the polysilicon layer. Depositing such a layer on the surface of the silicon is in fact a routine measure in order to protect the silicon from undesired degradation throughout the manufacturing steps of integrated circuits.

Accordingly, the interference spectrometry may use the polysilicon layer and the nitride layer as the two reflective surfaces required for interference spectroscopy.

The thickness of the polysilicon layer that should remain on the surface depends on the particular geometric conditions of the trench and on the thickness of the polysilicon layer that is intended to be on the bottom of the trench. In many typical applications, like forming capacitors, the etching will be stopped when the remaining polysilicon layer is between 10 and 30 nm thick.

The etching can, for example, be stopped when the remaining polysilicon layer is about 20 nm thick. This value has been proven to be useful in the manufacturing of capacitors in DRAM structures.

The thickness of the layer correlates with the values determined by interference spectroscopy. The correlation does not need to be calculated, but may be determined experimentally. For this purpose, the etching of samples is stopped, their values for spectrometry is determined, and a cross section of same is subjected to electron microscopy, where the thickness of the polysilicon layer can easily be determined. Through this approach, the spectroscopic value for a particular thickness can easily be determined.

The wavelength of the emitted light depends on the particular model of the spectrometer that is used and on the concrete application. A wavelength of 257 nm was found to be suitable for most applications.

The recess etch step gives the polysilicon layer its final thickness and shape. Therefore, it must fulfil particular requirements. The inventors have found out that the recess etching is advantageously performed using hydrogen bromide, chlorine. The etching atmosphere may preferably be diluted with a helium/oxygen mixture or any other comparable inert gas or gas mixture having similar properties. Due to the effect of microloading, one gets a higher etch rate within the trench, compared to the overfill areas (areas on top of the nitride). This beneficial effect results in the desired, substantially planar surface of the finished polysilicon layer within the trench, since it compensates for the initially bulged periphery of the polysilicon material at the trench. The first etch step using SF6/CF4 provides for a substantially planar surface on top of the wafer. Softlanding is performed by in-situ measurement employing interference spectrometry. The substantially planar surface which is achieved by the above mentioned etch gases has a slight recess within the trench area. The switch to Cl2/HBr etch gases for the trench etch has microtrenching properties so that the etching behaviour near the sidewalls of the trench is faster than the etching in the center of the trench. As a result, the trench is efficiently etched without leaving residues on the sidewalls of the trench leading to a substantially planar surface at the bottom of the trench.

The trench formed with the present invention might, for example, form part of a capacitor. The manufacturing of a capacitor is in fact a very preferred application of the present invention and was the initial reason for the inventor's search for improving the planarization and the recess process.

The polysilicon layer is preferably deposited onto the integrated circuit by a low pressure chemical vapour deposition step.

Other features which are considered as characteristic for the invention are set forth in the appended claims.

Although the invention is illustrated and described herein as embodied in a process for planarization and recess etching of integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the present invention, the hitherto employed step of CMP: for planarizing has been replaced by an etch step that can easily be integrated into the whole manufacturing process of integrated circuits. The progress of etching the polysilicon layer is preferably monitored by measuring its remaining thickness. Finally, the polysilicon in the trenches is removed by recess etching until only a substantially planar polysilicon layer within the trenches remains.

Figure 1A:
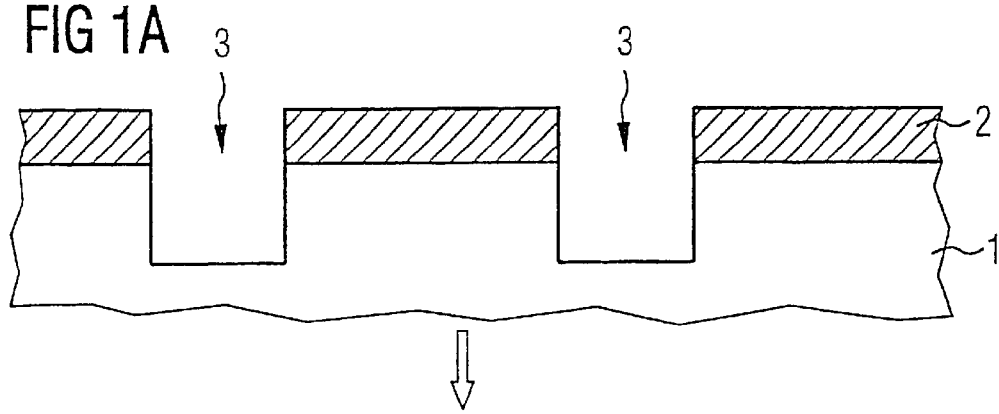
FIGS. 1A–1D show the inventive process for planarization.
Figure 1B:
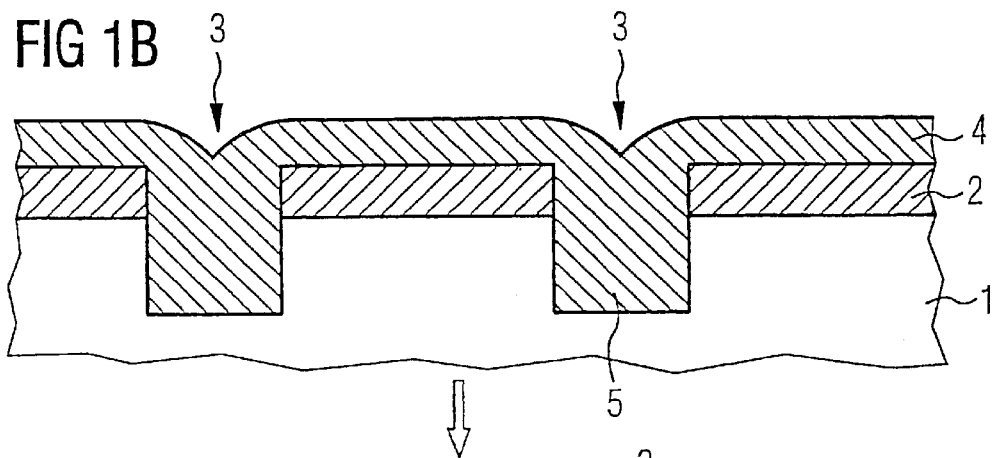

FIGS. 1A–1D schematically illuminate the inventive process by showing the consecutive stages of a silicon surface viewed in cross section. FIG. 1A shows the initial state of the surface before any polysilicon is deposited onto it. The silicon 1 containing the circuit structures is overlayed by a nitride layer 2. Trenches 3 extend through both layers, e.g. deep trenches for capacitors. As shown in FIG. 1B, the entire surface of the integrated circuits, i.e. the wafer, is then covered with a polysilicon layer 4 (called an "overfill" outside the trenches) which also fills the trenches 3 with a plug 5.

Figure 1C:
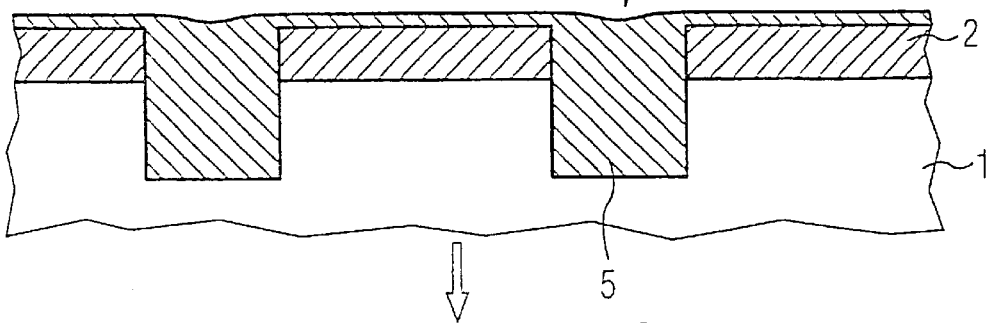
Figure 1D:
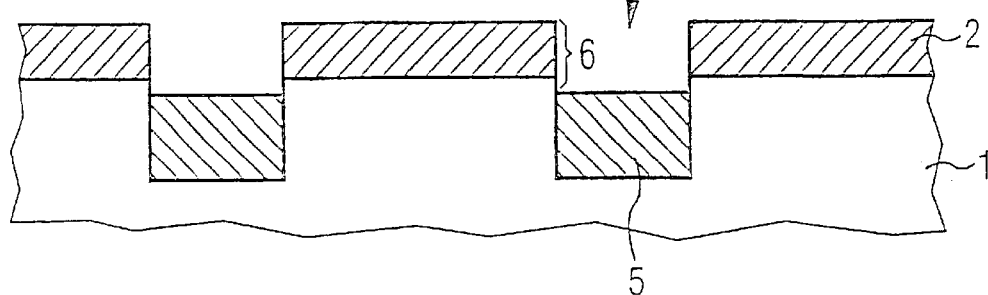

The inventive process starts with a first etch step. This process step may be typically run at a pressure of 0.4 Pascal with a source power of about 1500 W and a bias power of about 120 W. As etch gases, CF4 and SF6 are used. The flow rate for $CF_4$ may e.g. be from 40 to 60 sccm (standard cubic centimeters per minute), e.g. 52 sccm, while the flow rate for $SF_6$ could preferably be 30 to 50 sccm, e.g. 43 sccm. The process time under such conditions is preferably about 30 seconds. These parameters may, however, be varied according to the general knowledge of a person skilled in the art. The result of the first etch step is shown in FIG. 1C. The thickness of the polysilicon overfill layer 4 has been substantially reduced, while the plugs remain unchanged. However, depending on the particular formation of the process, a portion of the plugs 5 could also be removed at the first etch step. When the etching has led to the result shown in FIG. 1C, the etch step is stopped, and a further etch step, namely a recess etching with microtrenching properties is started which removes portions of the plugs 5. Conditions for this process may typically include a pressure of 0.53 Pascal at a source power of about 960 W and a bias power of about 240 W. The flow rate for $Cl_2$ can be e.g. 135 sccm, the flow rate for HBr can preferably be 40 to 50 sccm, e.g. 45 sccm, and the flow rate for $He/O_2$ can preferably be 10 to 25 sccm, e.g. 16 sccm. The process time will under such conditions preferably be about 30 seconds. Variations of these parameters are possible and will be contemplated by skilled persons. The result of this etch step is shown in FIG. 1D. In this example, the polysilicon layer 4 was removed altogether, as preferred. Alternatively, a very thin polysilicon overfill layer may still remain on nitride layer 2.

The integrated planarisation and recess etch process according to the invention can be performed within the same etch chamber with an in-situ measurement capability, preferably using interferometric spectrometry by simply switching the etch chemistry in response to a signal from the interferometric spectrometry measurement device. The integrated etch process can be performed within the same chamber without breaking the vacuum.

The plugs 5 are also eroded, while a substantially planar surface of the plug is formed. This leads to a recess 6 having the desired depth within the trench. In the example shown, the plug is no longer in contact with the nitride layer 2. This however, may depend on the concrete embodiment and the requirements and kinds of the manufactured trenches.

Figure 2A:
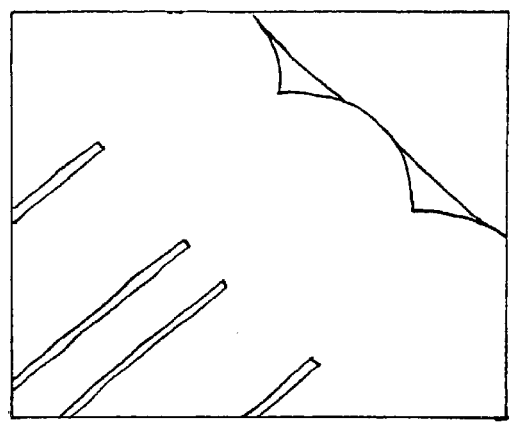
FIGS. 2A–2C show electron microscopy photographs of a trench made by a prior art process in several stages of manufacturing.
Figure 2B:
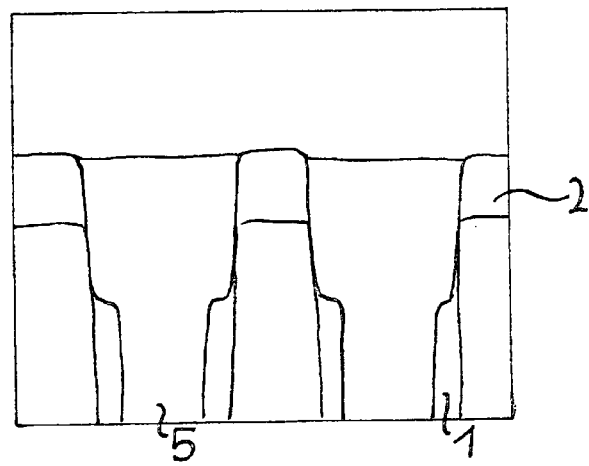
Figure 2C:
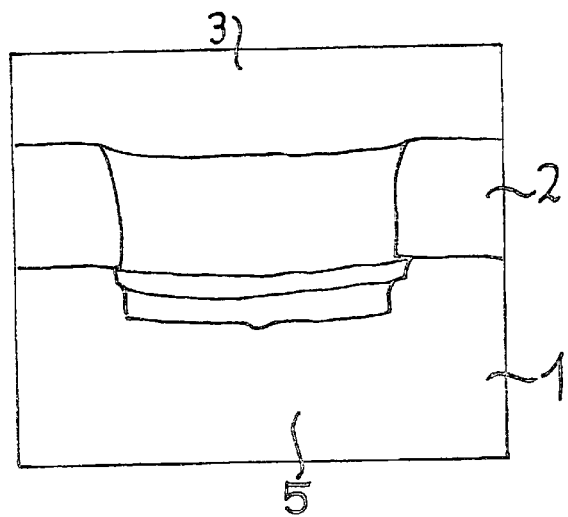

FIGS. 2A–2C show photographs of an electron microscopy of cross sections of material treated according to prior art processes. FIG. 2A shows the region close to the surface of the wafer after the polysilicon layer has been deposited and prior to planarization. In this photograph, the surface runs from the middle of the upper edge to the middle of the right edge. The same reference. numerals indicate the same structures as in FIGS. 1A–1D.

FIG. 2B, which is rotated relative to FIG. 2A; shows the surface of the wafer after the CMP step. The polysilicon overfill is completely removed, while the plugs 5 still remain in the trenches. In FIG. 2C, finally, the end product after the etching is shown. As can be recognized from FIG. 2B, the trench 3 shows a niche in the silicon layer 1 where it confronts the nitride layer 2.

Figure 3A:
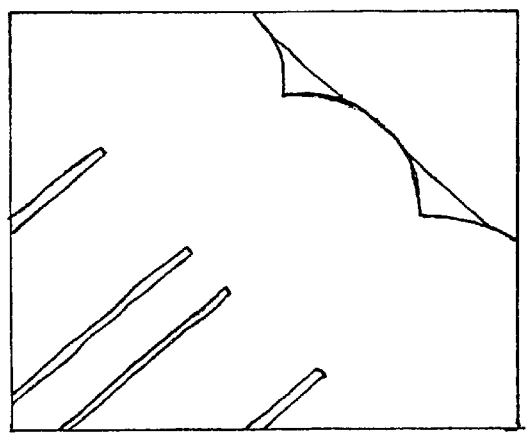
FIGS. 3A–3C show electron microscopy photographs of a trench made by the inventive process in several stages of manufacturing.
Figure 3B:
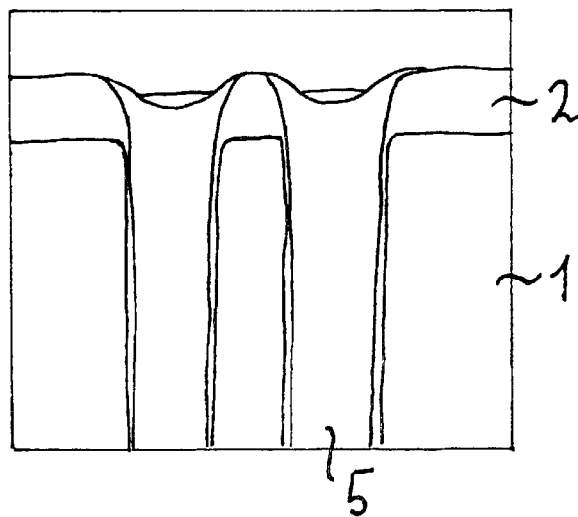
Figure 3C:
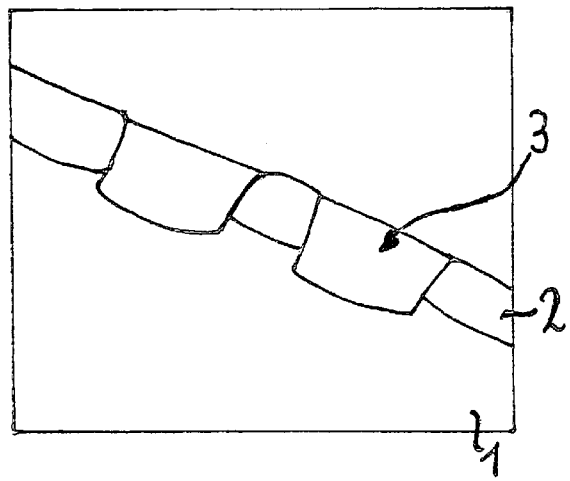

FIGS. 3A–3C show an example of trenches manufactured according to the invention. FIG. 3A corresponds to FIG. 2A. FIG. 3B shows the surface of the wafer after the first etching step. As can be seen, there is still a thin polysilicon overfill layer 4 overlaying the nitride layer 2. After the second etching, the recess etch step, the recesses 6 are formed and the polysilicon overfill layer 4 is completely removed as can be seen from FIG. 3C. These recesses 6 show smoother walls then the recesses produced by the prior art CMP process.

The inventive process allows for the production of recesses, e.g. in capacitor trenches, with integrated circuits. The invention is particularly useful as an integrated planarization process for low aspect ratio recess etching. The inventive process results in a reduction of the cycle time due to the integrated processing that is made possible. The total production and tool cost is reduced by eliminating the unfavourable CMP step. Further, no tool modifications are required, so that available resources can be used.

I claim:

1. A process for forming a recess in at least one polysilicon overfilled trench in an integrated circuit, which comprises:

uniformly etching a polysilicon overfill layer using a gas mixture including SF6 and CF4;

stopping the etching before the polysilicon layer is completely removed from a surface of the integrated circuit; and recess etching the polysilicon layer with microtrenching properties using a gas mixture including hydrogen bromine and chlorine for forming a substantially planar surface of the polysilicon layer within the trench.

2. The process according to claim 1, wherein: the etching includes a plasma etching.

3. The process according to claim 1, wherein: the stopping of the etching is decided based on measuring a layer thickness of the polysilicon layer.

4. The process according to claim 3, wherein: the measuring of the layer thickness of the polysilicon layer is performed by interference spectrometry.

5. The process according to claim 4, which comprises:

interposing a nitride layer between silicon of the integrated circuit and the polysilicon layer.

6. The process according to claim 5, wherein: the interference spectrometry uses the polysilicon layer and the nitride layer.

7. The process according to claim 1, which comprises:

interposing a nitride layer between silicon of the integrated circuit and the polysilicon layer.

8. The process according to claim 1, wherein: the stopping of the etching is performed when the polysilicon layer that remains is between 10 and 30 nm thick.

9. The process according to claim 1, wherein: the stopping of the etching is performed when the polysilicon layer that remains is about 20 nm thick.

10. The process according to claim 1, wherein: the recess etching is performed using a helium/oxygen mixture.

11. The process according to claim 1, which comprises:

providing the trench as part of a capacitor.

12. The process according to claim 1, which comprises:

depositing the polysilicon layer onto the integrated circuit using a low-pressure chemical vapour deposition process.

13. The process according to claim 1, which comprises:

performing the etching of the polysilicon layer within an etch chamber; and performing the recess etching of the polysilicon layer within the etch chamber.

14. The process according to claim 1, which comprises:

performing the etching of the polysilicon layer within an etch chamber in a vacuum; and performing the recess etching of the polysilicon layer within the etch chamber without breaking the vacuum.

* * * * *

UNITED STATES PATENT AND TRADEMARK OFFICE
CERTIFICATE OF CORRECTION

PATENT NO.   : 6,593,242 B2                                              Page 1 of 1
DATED        : July 15, 2003
INVENTOR(S)  : Thomas Morgenstern It is certified that error appears in the above-identified patent and that said Letters Patent is hereby corrected as shown below:

<u>Title page,</u>
Item [73], Assignee, should read as follows:
-- Infineon Technologies SC300 GmbH & Co. KG, Dresden (DE) --

Signed and Sealed this

Sixth Day of January, 2004

JAMES E. ROGAN
*Director of the United States Patent and Trademark Office*